United States Patent [19]
Scholder et al.

[11] Patent Number: 5,831,821
[45] Date of Patent: Nov. 3, 1998

[54] COMPUTER HAVING AN EXPANSION CARD CAGE ASSEMBLY

[75] Inventors: Erica Scholder; Timothy Radloff; Karl Steffes, all of Austin; Stephen Cook, Georgetown, all of Tex.

[73] Assignee: Dell Computer Corporation, Austin, Tex.

[21] Appl. No.: 788,668

[22] Filed: Jan. 24, 1997

[51] Int. Cl.$^6$ .............................. G06F 1/16; H01R 13/62; H05K 7/10

[52] U.S. Cl. ........................... 361/686; 361/683; 439/160

[58] Field of Search ........................ 364/708.1; 439/157, 439/61, 160, 928, 928.1; 361/683, 684, 686, 754, 798

[56] References Cited

U.S. PATENT DOCUMENTS

| | | |
|---|---|---|
| 4,924,355 | 5/1990 | Mitchell et al. . |
| 5,036,481 | 7/1991 | Lunsford et al. . |
| 5,317,483 | 5/1994 | Swindler . |
| 5,337,464 | 8/1994 | Steffes . |
| 5,338,214 | 8/1994 | Steffes et al. ............................ 439/160 |
| 5,438,476 | 8/1995 | Steffes . |
| 5,513,329 | 4/1996 | Pecone . |
| 5,544,006 | 8/1996 | Radloff et al. ........................... 361/683 |
| 5,568,610 | 10/1996 | Brown . |
| 5,575,546 | 11/1996 | Radloff . |
| 5,600,801 | 2/1997 | Parks et al. . |
| 5,604,871 | 2/1997 | Pecone . |

*Primary Examiner*—Michael W. Phillips
*Attorney, Agent, or Firm*—Haynes and Boone, L.L.P.

[57] ABSTRACT

A computer in which an expansion card cage assembly is mounted in the computer chassis. The expansion card cage assembly includes a wall extending parallel to the chassis wall, a riser card mounted relative to the wall of the cage assembly and having a connector adapted to engage the connector of the motherboard, and at least one expansion card connected to the riser card. A lever is provided on the cage assembly wall and is adapted to engage the chassis wall to quick-detachably connect the cage assembly to the chassis.

12 Claims, 8 Drawing Sheets

COMPUTER HAVING AN EXPANSION CARD CAGE ASSEMBLY

TECHNICAL FIELD

An embodiment of the invention relates generally to the field of computers, and the like, and, more particularly, to a computer having a removable expansion card cage assembly.

BACKGROUND

Almost all desktop computers provide a number of expansion slots that allow the user to install optional cards, such as network cards, sound cards and SCSI device interface cards. According to the most commonly used methodology, connectors are provided on a riser card for receiving the expansion cards; and the riser card, in turn, plugs into a connector on the system motherboard.

There are several problems with these types of arrangements. For example, when a design goal for the computer is to make it smaller and more compact, the layout of the computer is such that the expansion cards and the riser card must often be removed to replace the expansion cards or to access other computer components. Since this often entails the use of tools, the unplugging of cables, and the removal of the expansion cards from the connectors on the riser card, it is considerably inconvenient and time-consuming.

Also, since the force required to install and remove the riser card from the connector on the system motherboard is approximately 30–45 pounds, it can cause operator or user inconvenience. Similarly, on an assembly line, long term repetitive activity of this type can cause inconvenience. Also, users are often reluctant to apply this type of brute force to their computer.

Still another problem with expansion cards and associated components of this type is that, unless there is a good alignment strategy for the mating of their respective connectors, the connectors can easily be damaged during their installation and removal, both on the assembly line and by the user or service technician.

Therefore what is needed is an expansion card cage assembly that is easily removable from the computer as a single unit with a minimum of force without using any tools or removing any other components in the computer. Also, what is needed is an assembly of the above type in which the assembly can be removed and installed in the above manner while maintaining a good alignment strategy.

SUMMARY

According to an embodiment of the computer of the present invention, an expansion card cage assembly is provided which has a wall extending parallel to the wall of the chassis of the computer. At least one expansion card is mounted relative to the cage assembly wall, and a lever is pivotally mounted on the cage assembly wall and adapted to engage the chassis wall to quick-detachably connect the cage assembly to the chassis.

Several advantages are achieved by the above. For example, the expansion card cage assembly of the present invention can easily be removed from the computer as a single unit with a minimum of force without using any tools or removing any expansion cards that may be installed. Also, the assembly of the present invention can be removed and installed in the above manner while maintaining a good alignment strategy.

DETAILED DESCRIPTION OF THE PREFERRED EMBODIMENT

Figures 1, 6:
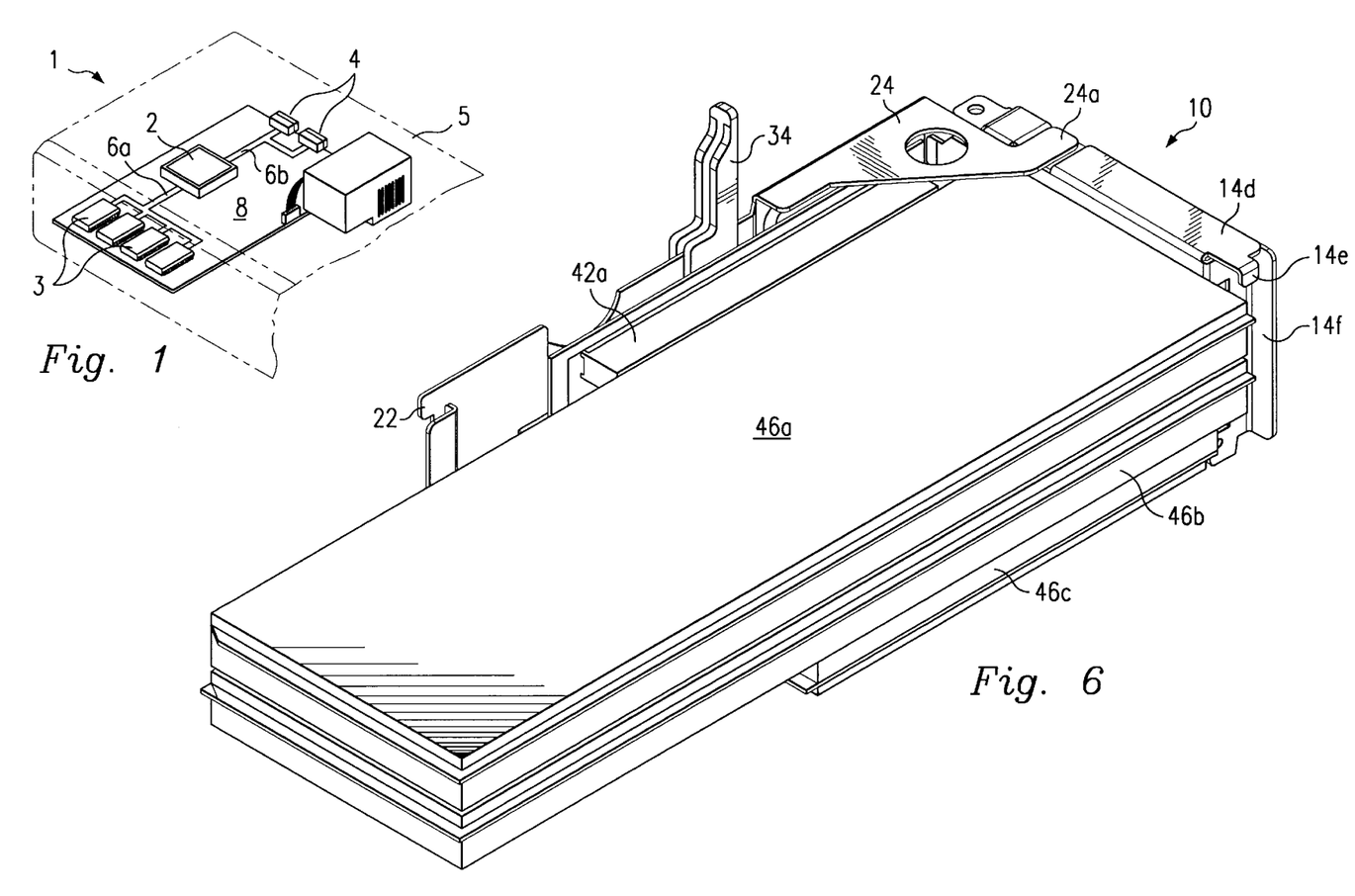
FIG. 1 is a schematic view of the computer according to an embodiment of the present invention.
FIG. 6 is a view similar to FIG. 5 but showing expansion cards installed in the cage assembly

The personal computer according to an embodiment of the present invention is referred to, in general by the reference numeral 1 in FIG. 1 of the drawings, and may be in the form of a desktop computer, a laptop computer or a tower computer. The personal computer 1 includes a processor 2, a memory device 3, and two input/output (I/O) devices 4, all contained within a chassis 5. Two buses 6a and 6b connect the processor 2 to the memory 3 and to the input/output devices 4, respectively, it being understood that other electrical traces (not shown) are provided for connecting the components of the computer 1. A mother board 8 is also contained in the chassis 5 for mounting and interconnecting various electrical circuits and related devices. Since the computer shown in FIG. 1 is conventional, it will not be described in any further detail.

Figures 2, 3:
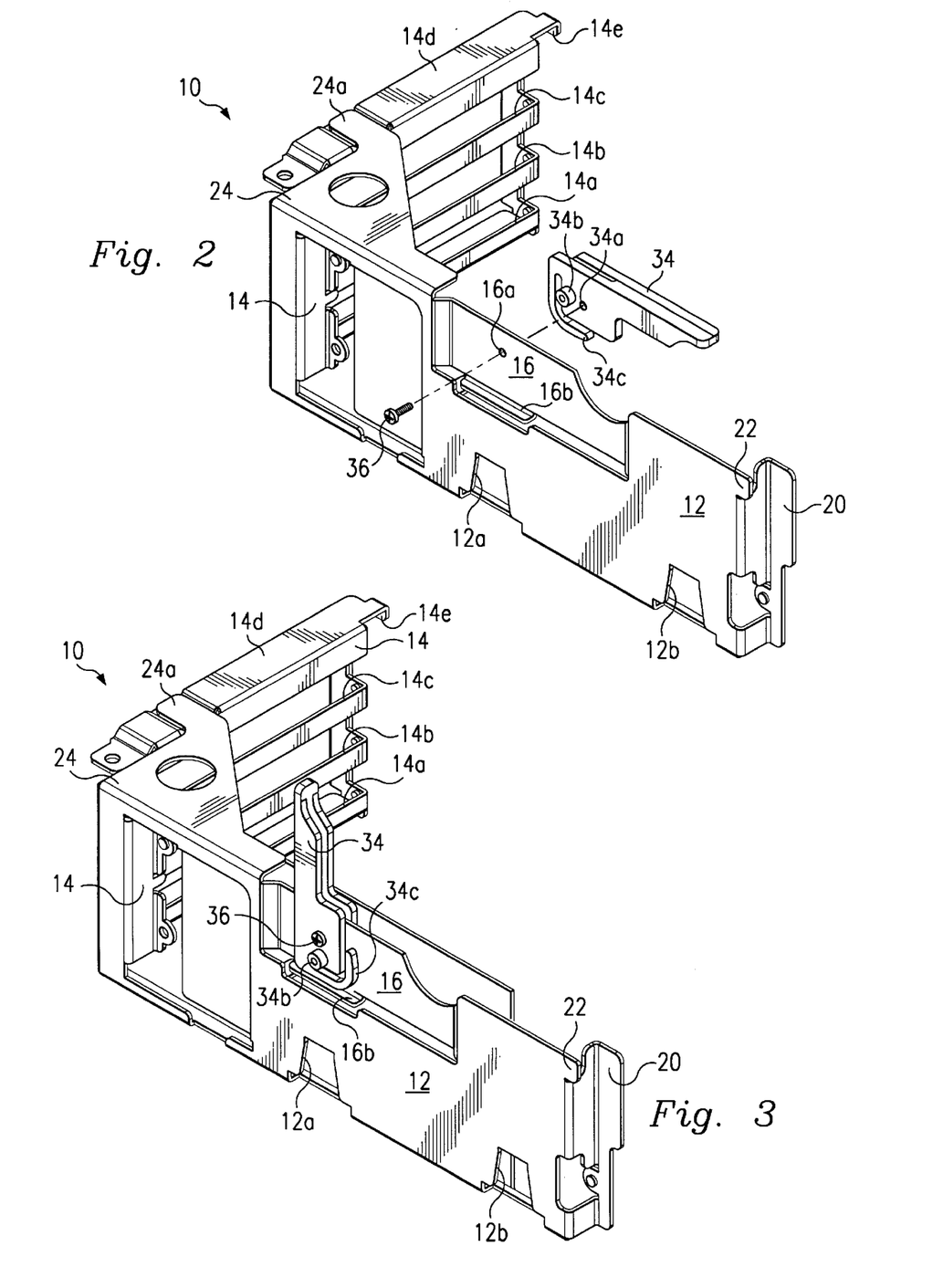
FIG. 2 is a front, exploded, enlarged isometric view of the expansion card cage assembly utilized in the computer of FIG. 1.
FIG. 3 is a view similar to FIG. 2 but depicting the cage assembly fully assembled with its actuating lever in an unlocked position.

Referring to FIGS. 2 and 3 of the drawings, the reference numeral 10 refers, in general, to the expansion card cage assembly of the present invention which is adapted to be mounted on the chassis 5. The cage assembly 10 is formed by two upright walls 12 and 14 extending at right angles to each other. The walls 12 and 14 are preferably formed from a single plate of sheet metal which is bent at a right angle.

The wall 12 is configured to define a recessed portion 16 extending slightly inwardly from the plane of the wall and having a through opening 16a. A horizontally-extending tab 16b extends outwardly from the recessed wall 16 and two spaced slots 12a and 12b are formed in the lower portion of the wall 12. The distal end of the wall 12 is bent to form a flange 20, and a tab 22 extends from the upper edge of the latter end of the wall.

A horizontally-extending tab 24 extends diagonally from the wall 12 to the wall 14. The wall 14 has three horizontally-extending elongated slots 14a–14c extending therethrough, it being understood that this number can vary depending on the particular design. The wall 14 also has a horizontally-extending upper portion 14d which is formed by bending the upper portion of the wall. An arm 24a extends outwardly from the tab 24 and is secured, in any conventional manner, to the upper wall portion 14d. An end of the upper wall portion 14d is bent downwardly to form a tab 14e.

Figure 4:
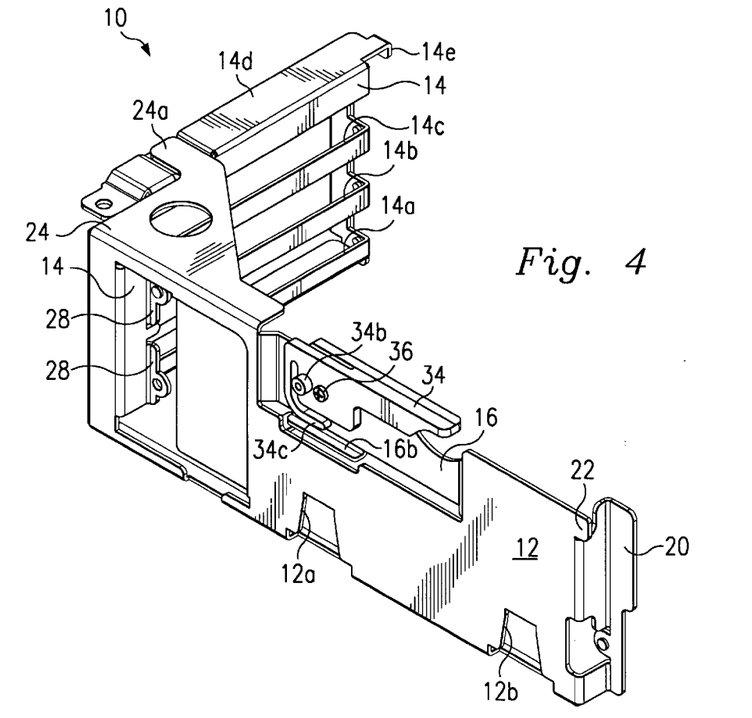
FIG. 4 is a view similar to FIG. 3 but depicting the cage assembly with the actuating lever in a locked position.

An actuating lever 34, preferably formed of plastic, is pivotally attached to the recessed wall portion 16 by a screw 36, or any other fastening device, that extends through the opening 16a and through a corresponding opening 34a extending through the lever. A post 34b is formed on the lever 34 and extends outwardly from the plane of the wall 12 and an arcuate slot is formed through the lever 34 that defines an arcuate spring portion 34c. The lever 34 is depicted in its upright, unlocked position in FIG. 3 in which the spring portion 34c of the lever 34 engages the tab 16b, creating a spring tension that maintains the lever in the unlocked position. The lever 34 is pivotal from the locked position of FIG. 3 to a locked position shown in FIG. 4 in which it extends substantially horizontally. La the latter position the post 34b engages a wall of the above-mentioned computer chassis (not shown in FIG. 4) in a manner that will be described.

Figure 5:
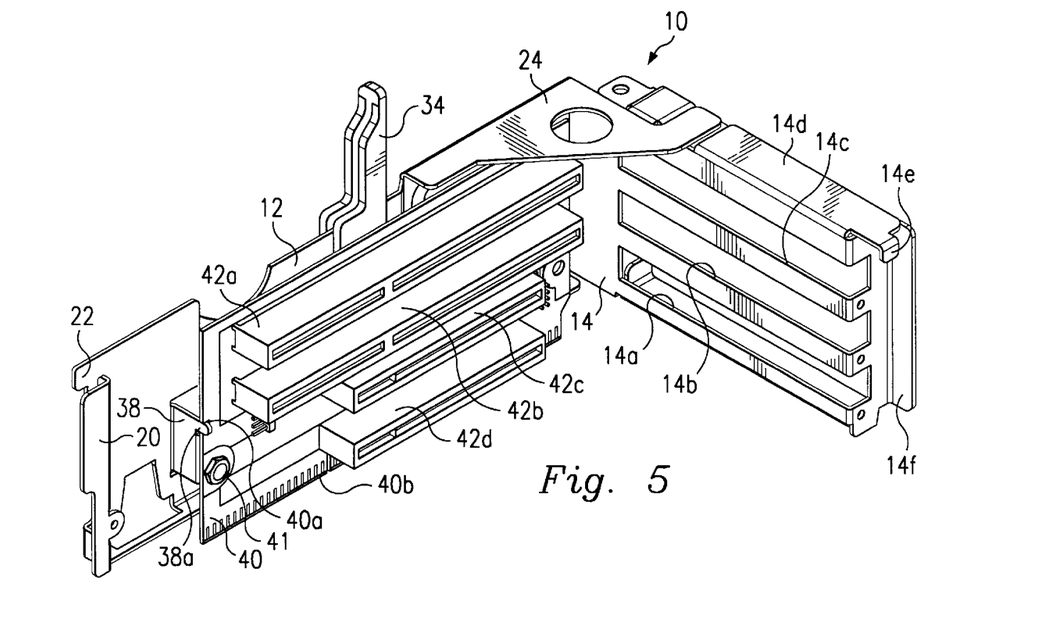
FIG. 5 is a rear isometric view of the cage assembly of FIG. 4.

Referring to FIG. 5, the distal end portion of the wall 14 is bent in two planes to form a portion 14F extending parallel to the wall 14. A pair of mounting flanges, one of which is shown by the reference numeral 38, extends from the inner portion of the wall 12 and can be formed integrally with the wall 12 or can be fastened thereto in any conventional manner. A vertically-extending riser card 40 extends parallel to, and slightly spaced from, the wall 12 in engagement with the flange 38. A tab 38a is formed on each flange 38 and extends in a notch 40a provided at one end of the riser card 40. A fastener 41 extends through an opening in the card 40 and through an aligned opening in the flange 38 to secure the card to the flange. It is understood that the other end of the card 40 engages a flange and a tab identical to the flange 38 and the tab 38a and is fastened to the latter flange in an identical manner.

The riser card 40 has a standard edge connector 40b on its lower edge portion, as viewed in FIG. 5, which is adapted to engage in a slot formed in a connector on a motherboard (not shown in FIG. 5), in a manner to be described. Four vertically-spaced expansion card connectors 42a–42d are mounted on the riser card 40 and project inwardly. The connectors 42a and 42b each have two, slots for receiving expansion cards, and the connectors 42c and 42d have one slot for the same purpose, as will be explained.

As shown in, FIG. 6, three expansion cards 46a–46c are mounted on the cage assembly 10 and can be in the form of network cards, sound cards and/or SCSI device interface cards. To this end, it is understood that a plurality of standard edge connectors (not shown) are provided on the respective inner edges of the cards 46a–46c which extend in three of the slots in the connectors 42a–42d. The rear end portions of the expansion cards 46a–46c are accessible via the slots 14a–14c in the wall 14 to enable cables, connectors or the like to be plugged into appropriate slots, jacks, or the like (not shown) provided on the corresponding ends of the cards.

Figure 7:
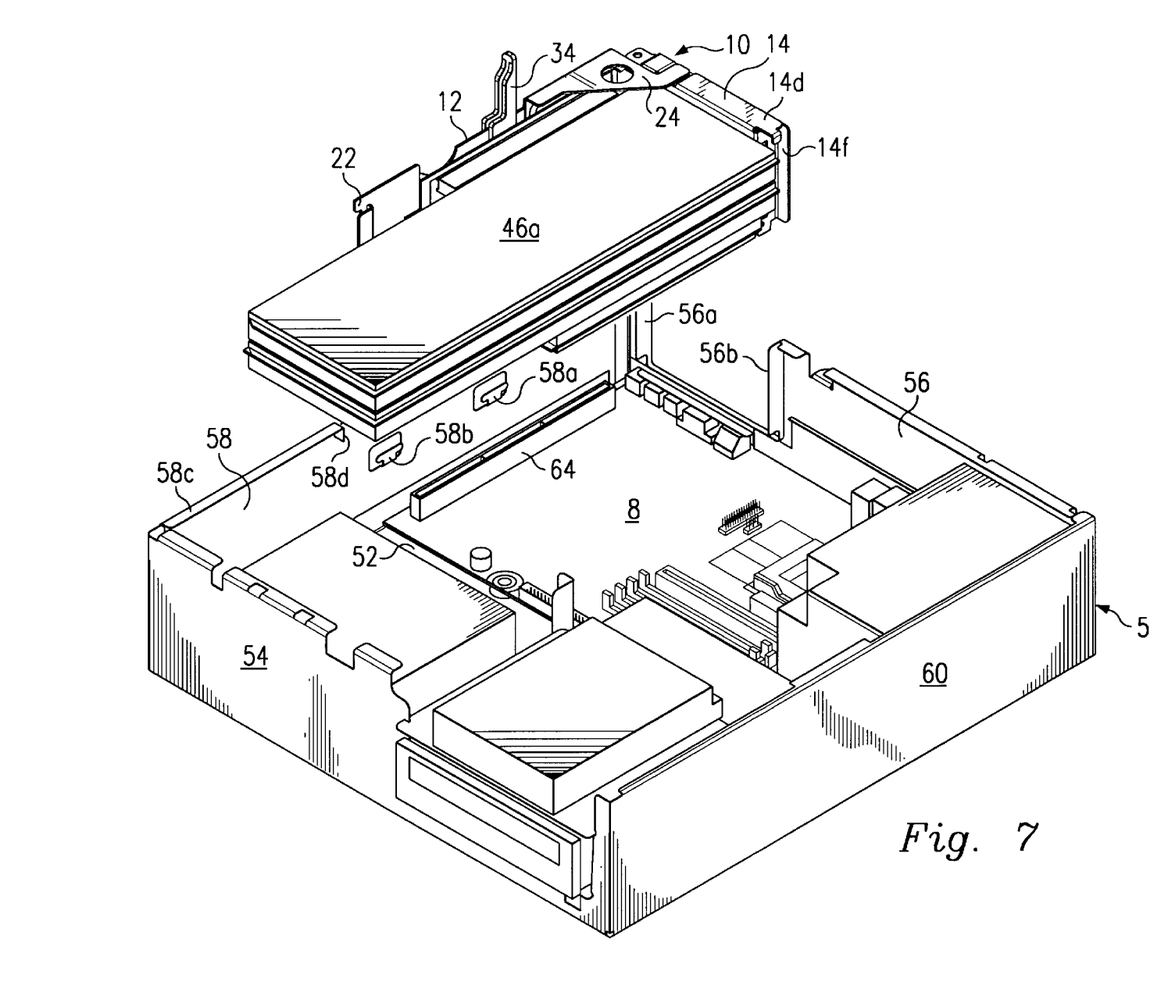
FIG. 7 is an isometric view, on a reduced scale, from the front of the chassis of the computer of FIG. 1, depicting the cage assembly and expansion cards of FIG. 5 positioned above the chassis.

FIG. 7 depicts the cage assembly 10, including the expansion cards 46a–46c, positioned above the chassis 5 (shown generally in FIG. 1). The chassis 5 includes a bottom wall, or floor, 52, a front wall 54, a rear wall 56 and two sidewalls 58 and 60, all of which extend perpendicular to the bottom wall. A rectangular opening 66a is provided in the rear wall 56 which substantially corresponds, in width and height, to the wall 14 of the cage assembly 10. A portion 56b of the wall 56 adjacent the opening 56a is bent inwardly and extends at right angles to the wall 56 to guide the cage assembly 10 into the chassis 5 during assembly, as will be described.

Two horizontally spaced, inwardly-extending hooks 58a and 58b are formed on the wall 58 and extend inwardly from the plane of the wall for engaging the slots 12a and 12b of the cage assembly 10 in the assembled position of the assembly. An extended upper portion 58c of the wall 58 is bent inwardly to extend at right angles to the latter wall. The inner end portion of the upper bent portion 58c is bent downwardly to form a tab 58d for guiding the cage assembly 10 into the chassis 5 during assembly.

The motherboard 8 (shown generally in FIG. 1) is provided on the bottom wall 52 of the chassis 5 and a connector 64 extends upwardly from the motherboard for receiving the edge connector 40b (not shown in FIG. 7) of the riser card 40 as will be shown and described. Components of the computer 1 shown in FIG. 1, as well as other standard components, are located in the chassis 5 but will not be described since they do not form any part of the present invention. It is understood that the chassis 5 is fabricated from sheet metal and forms an inner housing for the computer 1, and that an outer housing (not shown), preferably of plastic, is placed over the chassis 5 to form a complete assembly.

Figure 8:
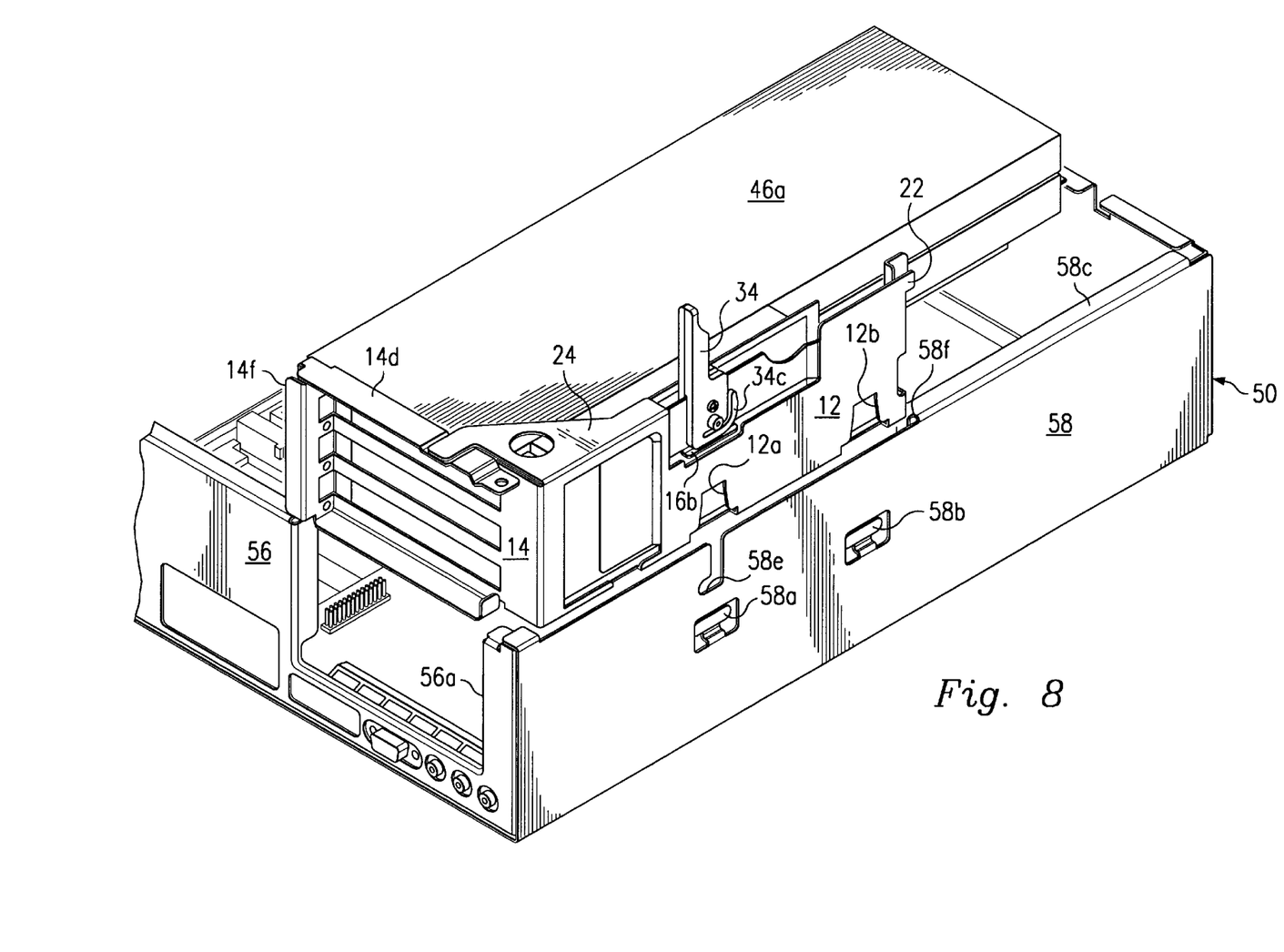
FIG. 8 is a partial isometric view from the rear of the chassis of FIG. 7, depicting the cage assembly immediately prior to installation on the chassis.
Figure 9:
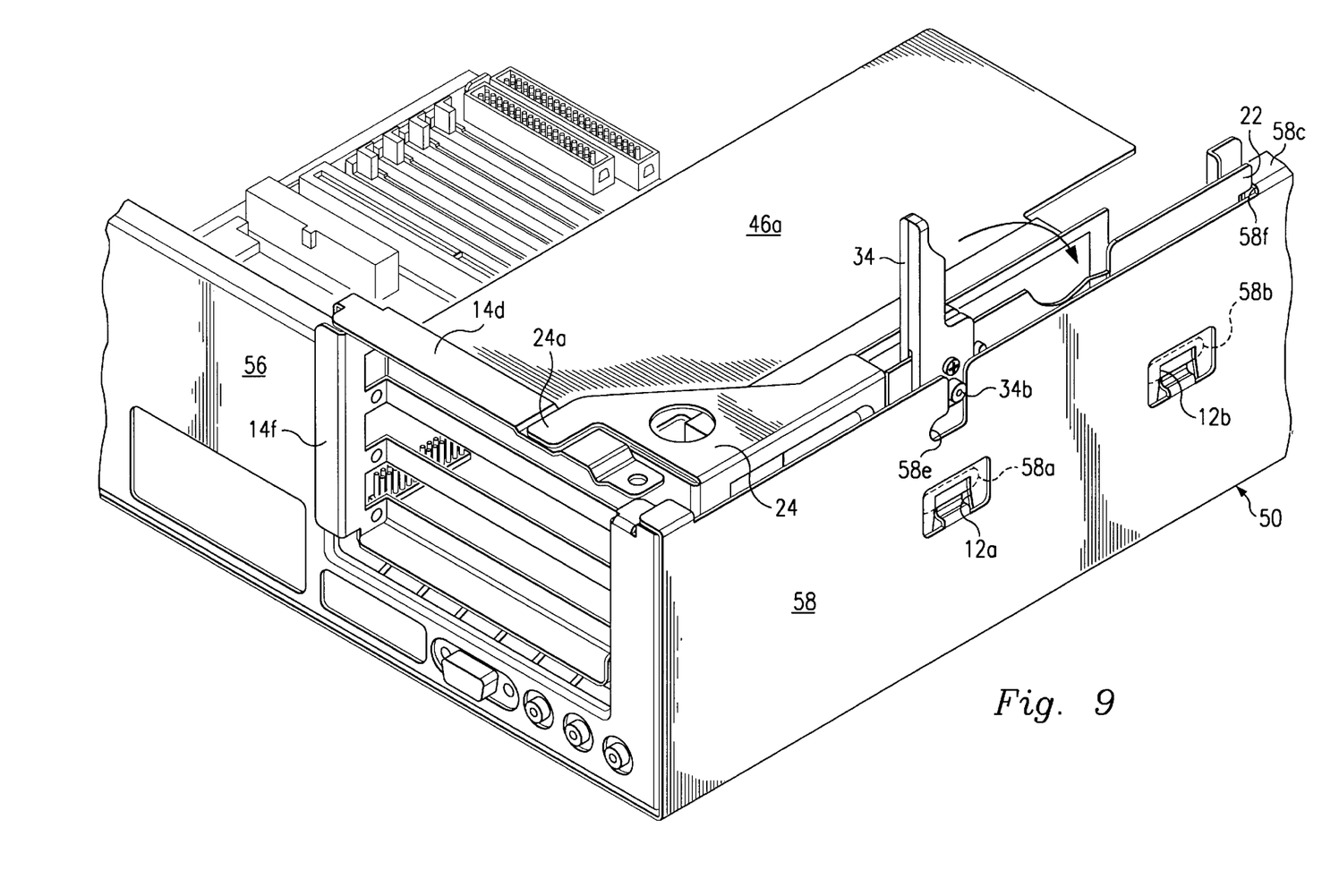
FIG. 9 is a view similar to FIG. 8, but depicting the cage assembly installed on the chassis with its actuating lever in its unlocked position.

As shown in FIG. 8, an L-shaped slot 58e is formed in the upper portion of the chassis wall 58 which receives the post 34b of the lever 34 in a manner to be described. The slot 58e has a vertical portion extending from the upper edge of the wall 58 and a horizontal portion extending from the vertical portion. As shown in FIG. 9, a slot 58f is also formed in the end of the wall portion 58 for reasons to be described.

To assemble the cage assembly 10 to the chassis 5, the cage assembly is positioned above the chassis with the walls 12 and the flange 14f of the assembly aligned with the walls 58 and 56, respectively, of the chassis, as shown in FIG. 8. The slots 12a and 12b in the wall 12 are also aligned with the hooks 58a and 58b, respectively, of the wall 58, and the lever 34 is placed in its upright, unlocked position.

Figure 10:
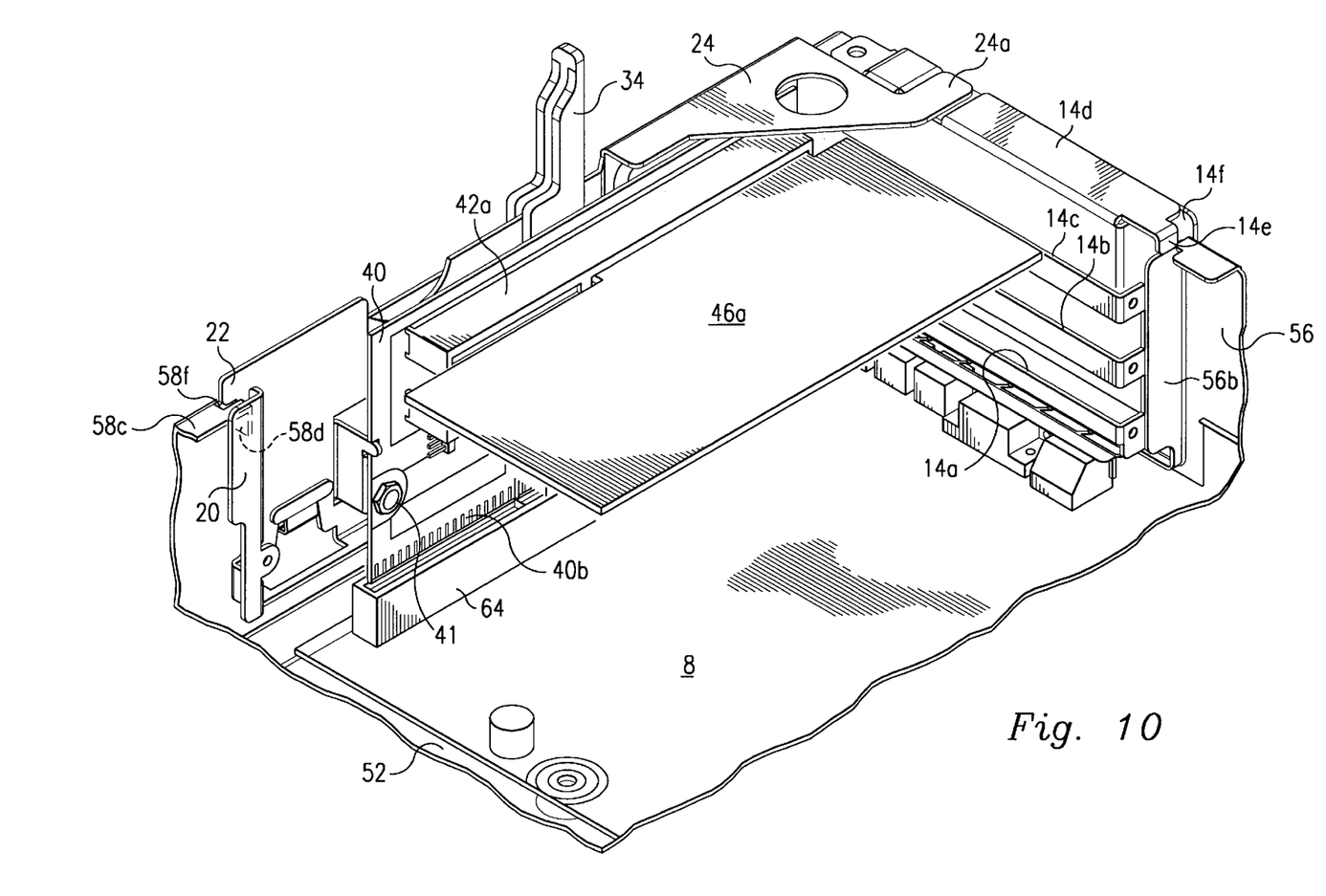
FIG. 10 is a view similar to FIG. 9 but from the inside of the chassis.

The cage assembly 10 is then lowered relative to the chassis 5 to the assembled position of FIGS. 9 and 10, with the wall portion 56b and the tabs 58a, 58b and 58d guiding this movement. In the assembled position, the slots 12a and 12b of the wall 12 of the cage assembly 10 extend over the hooks 58a and 58b of the chassis wall 58. Also, as better shown in FIG. 10, the tab 22 of the cage assembly 10 extends sin the slot 68f in the chassis 5, and the flange 20 of the cage assembly extends over the end of the wall portion 58c of the chassis. Further, the tab 14e of the cage assembly 10 extends over the wall portion 56b of the chassis 5. As better shown in FIG. 9, the portion 14f of the wall 14 extends over a portion of the wall 56 adjacent the slot 56a. The cage assembly 10 is thus precisely located in the chassis 5.

During the lowering of the cage assembly 10 into the chassis 5 as described above, the lever 34 is retained in its upright, docked position by the engagement of the spring portion 34c with the tab 1b as described above. Therefore, during this movement the post 34b of the lever 34 extends in the vertical portion of the slot 58e, as shown in FIG. 8.

As shown in. FIG. 10, in the assembled position of the cage assembly 10, the edge connector 40b of the riser card 40 extends in the motherboard connector 64 in the chassis 5 to complete the connections between the expansion cards 40a–40d and the motherboard 8. (The expansion cards 46b–46d are not shown in FIG. 10 to better show this connection.)

Figure 11:
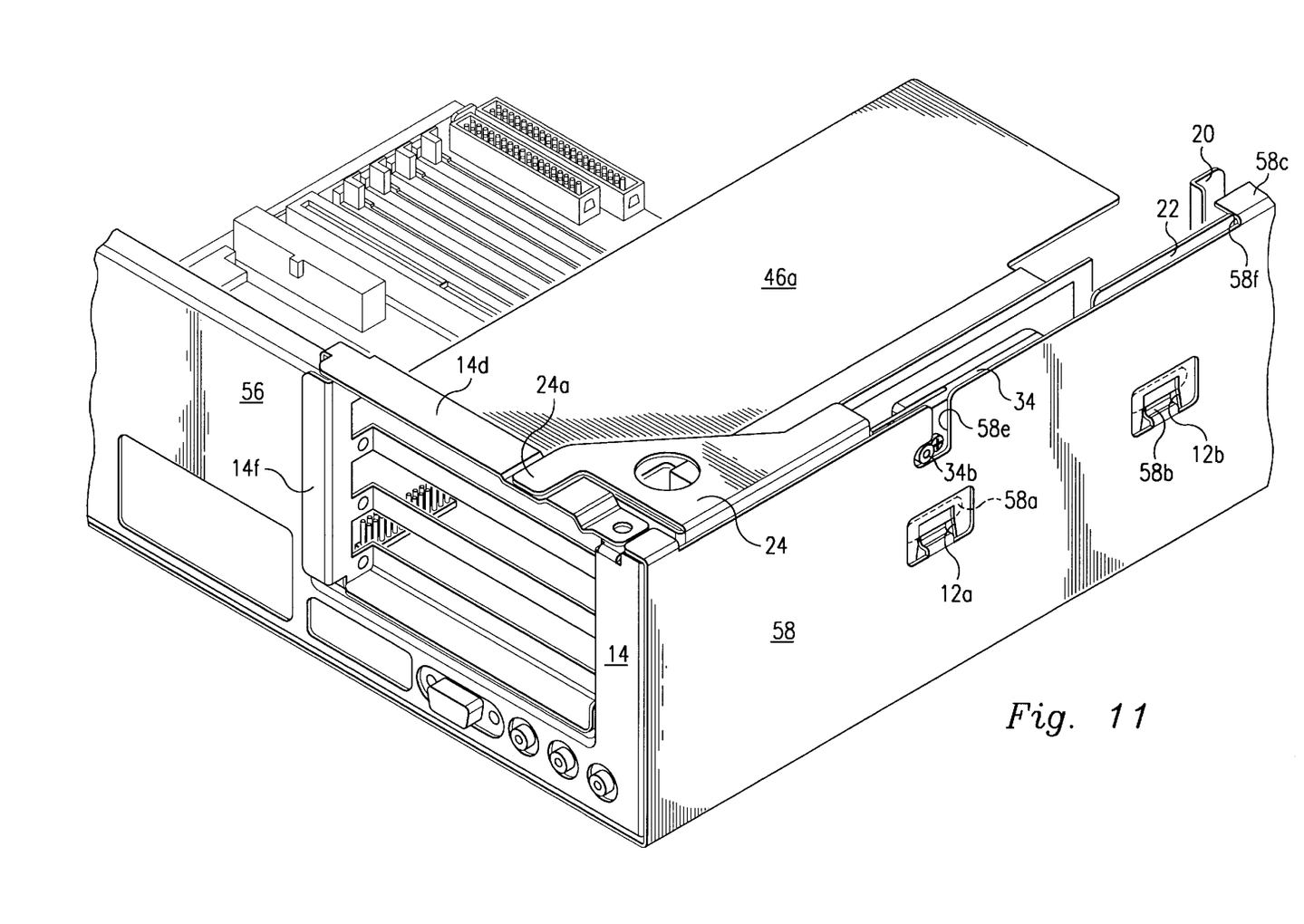
FIG. 11 is a view similar to FIG. 9 but depicting the cage assembly installed on the chassis with the actuating lever in its locked position.

To lock the cage assembly 10 in its assembled position relative to the chassis 5, the lever 34 is pivoted from its upright, unlocked position shown in FIGS. 8 and 9 to a locked position shown in FIG. 11. During this locking pivotal movement of the lever 34 from its unlocked position to its locked position, the riser card 40 is forced into the connector 64 and the post 34b on the lever 34 slides from the vertical portion of the slot 58e to the horizontal portion of the slot which secures the cage assembly 10 against any vertical movement relative to the chassis 5.

Thus the cage assembly 10 is quick-detachably connected to the chassis 5 in a manner to permit it to be easily and quickly installed to, and removed from, the chassis 5 with minimum force without using any tools. Also, when the lever 34 moves from its unlocked position to its locked position as described, it acts as a mechanical lever to reduce the force required to install the riser card 40 in the connector 64. Further, the expansion cards 46a–46c can be removed from the chassis 5 and replaced or repaired without disturbing any of the other components in the chassis. Further, the cage assembly 10 can be removed from and installed in the chassis in the above manner while maintaining a good alignment strategy with respect to the connections between the riser card 40 and the motherboard 8, and between the expansion cards 46a–46c and the riser card 40.

It is understood that the embodiment of the assembly of the present invention described above is intended to illustrate rather than limit the invention, and that the assembly of the present invention can take many other forms and embodiments within the scope of the invention. For example, the number of connectors, slots, expansion cards and tabs can vary within the scope of the invention.

What is claimed is:

1. A computer comprising:
    a chassis including a plurality of vertical walls;
    a motherboard disposed in the chassis and having a connector;
    a processor connected to the motherboard;
    a memory device connected to the motherboard;
    an expansion card cage assembly disposed in the chassis and including a first cage wall extending adjacent to a first chassis wall;
    a riser card mounted relative to the first cage wall and having a connector adapted to engage the connector of the motherboard;
    at least one expansion card connected to the riser card;
    the cage assembly including a lever on the first cage wall movable to engage and disengage the first chassis wall, whereby the cage assembly is detachably connected to the chassis.

2. The computer of claim 1 wherein the lever is pivotally mounted on the first cage wall and a post is formed on the lever that extends into a slot formed in the first chassis wall for urging the riser card into and out of connection with the motherboard.

3. The computer of claim 2 wherein the lever is pivotable from an unlocked position to a locked position during which it forces the riser card into engagement with motherboard connector.

4. The computer of claim 1 wherein the cage assembly further comprises a second cage wall extending perpendicular to the first cage wall and having a plurality of slots formed therein, and wherein the chassis has a second chassis wall extending perpendicular to the first chassis wall and having an opening extending therethrough, the second cage wall extending in the opening in the second chassis wall so that the slots permit access to the expansion card.

5. The computer of claim 1 further comprising hooks formed on the first chassis wall and slots formed on the first cage wall for engaging the hooks.

6. The computer of claim 1 further comprising guide surfaces formed on the chassis for guiding the cage assembly into the chassis.

7. The computer of claim 1 further comprising a tab formed on the cage assembly and adapted to engage a slot formed on the chassis.

8. A computer comprising:
    a chassis including a plurality of vertical walls and a motherboard having a connector;
    an expansion card cage assembly disposed in the chassis and including a first cage wall extending adjacent to a first chassis wall and at least one expansion card connected to a riser card mounted relative to the first cage wall;
    a lever pivotally mounted on the first cage wall and adapted to engage the first chassis wall, the lever being pivotally mounted on the first cage wall and including a post; and
    the first chassis wall including a slot for receiving the post, whereby movement of the post in the slot urges the riser card into and out of engagement with the connector on the motherboard.

9. The computer of claim 8 wherein the cage assembly further comprises a second cage wall extending perpendicular to the first cage wall and having a plurality of slots formed therein, and wherein the chassis has a second chassis wall extending perpendicular to the first chassis wall and having an opening extending therethrough, the second cage wall extending into the opening in the second chassis wall so that the slots permit access to the expansion cards.

10. The computer of claim 9 further comprising hooks formed on one of the chassis walls and slots formed on one of the cage walls for engaging the hooks.

11. The computer of claim 8 further comprising guide surfaces formed on the chassis for guiding the cage assembly into the chassis.

12. The computer of claim 8 further comprising a tab formed on the cage assembly and adapted to engage a slot formed on the chassis.

* * * * *

UNITED STATES PATENT AND TRADEMARK OFFICE
CERTIFICATE OF CORRECTION

PATENT NO. : 5,831,821
DATED : November 3, 1998
INVENTOR(S) : Erica Scholder et al.

It is certified that error appears in the above-identified patent and that said Letters Patent is hereby corrected as shown below:

Column 2,
Line 12, after "assembly", insert a -- . --

Column 3,
Line 20, before "the latter", delete "La" and insert -- In --.
Line 46, after "two", delete ",".
Line 49, after "in", delete ",".
Line 66, after "opening", delete "66a" and insert -- 56a --.

Column 4,
Line 50, before "the slot", delete "sin" and insert -- in --.
Line 50, after "the slot", delete "68f" and insert -- 58f --.
Line 59, after "upright", delete "docked" and insert -- unlocked --.
Line 60, after "tab", delete "1b" and insert -- 16b --.

Signed and Sealed this

Ninth Day of April, 2002

Attest:

JAMES E. ROGAN
Attesting Officer   Director of the United States Patent and Trademark Office